United States Patent [19]

Devin

[11] Patent Number: 4,958,324
[45] Date of Patent: Sep. 18, 1990

[54] METHOD FOR THE TESTING OF ELECTRICALLY PROGRAMMABLE MEMORY CELLS, AND CORRESPONDING INTEGRATED CIRCUIT

[75] Inventor: Jean Devin, Aix En Provence, France

[73] Assignee: SGS-Thomson Microelectronics SA, Gentilly, France

[21] Appl. No.: 269,169

[22] Filed: Nov. 9, 1988

[30] Foreign Application Priority Data

Nov. 24, 1987 [FR] France ................ 87-16236

[51] Int. Cl.$^5$ ........................ G11C 13/00; G06F 11/00
[52] U.S. Cl. ..................................... 365/201; 365/185;
365/189.08; 365/189.03; 371/21.4; 371/28
[58] Field of Search ........... 365/201, 210, 185, 189.03, 365/189.08; 371/21.4, 28

[56] References Cited

U.S. PATENT DOCUMENTS

| | | | |
|---|---|---|---|
| 4,253,059 | 2/1981 | Bell et al. ................ | 371/21.4 |
| 4,502,140 | 2/1985 | Proebsting ................ | 371/21.4 |
| 4,519,076 | 5/1985 | Priel ........................ | 365/201 |
| 4,553,225 | 11/1985 | Ohe ........................ | 371/28 |
| 4,670,878 | 6/1987 | Childers .................... | 365/201 |
| 4,714,839 | 12/1987 | Chung ...................... | 365/96 X |
| 4,720,817 | 1/1988 | Childers .................... | 365/96 X |
| 4,731,760 | 3/1988 | Maini ...................... | 365/201 X |
| 4,734,885 | 3/1988 | Luich ...................... | 365/96 X |
| 4,768,194 | 8/1988 | Fuchs ...................... | 365/201 |
| 4,779,272 | 10/1988 | Kohda et al. ............... | 365/201 |
| 4,788,668 | 11/1988 | Okada ...................... | 365/202 |
| 4,809,233 | 2/1989 | Shannon et al. ............. | 371/21.4 |
| 4,841,233 | 6/1989 | Yoshida .................... | 371/21 |

FOREIGN PATENT DOCUMENTS

| | | |
|---|---|---|
| 0029322 | 5/1981 | European Pat. Off. . |
| 0055906 | 7/1982 | European Pat. Off. . |
| 0098215 | 1/1984 | European Pat. Off. . |
| 0148510 | 7/1985 | European Pat. Off. . |
| 0159928 | 10/1985 | European Pat. Off. . |
| 0227965 | 6/1987 | European Pat. Off. . |
| 0224206 | 7/1987 | European Pat. Off. . |
| 0239283 | 9/1987 | European Pat. Off. . |
| 3637682 | 5/1987 | Fed. Rep. of Germany . |
| 80/01732 | 8/1980 | World Int. Prop. O. . |

OTHER PUBLICATIONS

Hewlett–Packard Journal, vol. 34, No. 8, 902 & 1983, pp. 20–24 Amstelveen Nl; Wheeler et al., "128K-BITN MOS . . . ", p. 23.
Patent Abstract of Japan, vol. 8, No. 151, p. 286, 13 Jul. 84; JP-A-59 48 898.
P. I EEE, vol. 74, No. 5, May 1986, pp. 684–698, W. R. Moore, "A Review of Fault . . . Circuit Yield" p. 684, col. 2, ln. 22, etc.
Patent Abstract of Japan, vol. 6, No. 51, (p-108), 6 Apr. 1982, p. 150, JP-A-56,165,984.
IEEE Trans. on Comp, vol. C-35, No. 2, Feb. 1986, pp. 99–106; Rich "A Survey of Multivalved Memories" 2P.101, l.11.
IEEE Jour. of Solid-State Cir., vol. SL-11, No. 4, Aug. 1976, pp. 514–528 Heald: "Multi-Level Random-Access . . . ".
Pat. Abstracts Japan, vol. 7, No. 253, 10 Nov. 1983; JP-A-58 137 181.
NEC Research and Development, No. 26, Jul. 1972.

*Primary Examiner*—Stuart N. Hecker
*Assistant Examiner*—Alfonso Garcia
*Attorney, Agent, or Firm*—Roland Plottel

[57] ABSTRACT

A method for testing electrically programmable memories is disclosed. To enable the measurement of the current of programmed cells and blank cells (and not only to check whether the cells are programmed or not), and to enable this measurement even after the memory has been encapsulated in a package, it is proposed herein to connect, in testing mode, the bit line of a cell to be tested with the programming terminals to which there is applied, in programming mode, the programming high voltage Vpp. A low voltage Vte is applied to this terminal in testing mode, and the current flowing between this terminal and the voltage source is measured. This current is the current of the tested cell.

9 Claims, 2 Drawing Sheets

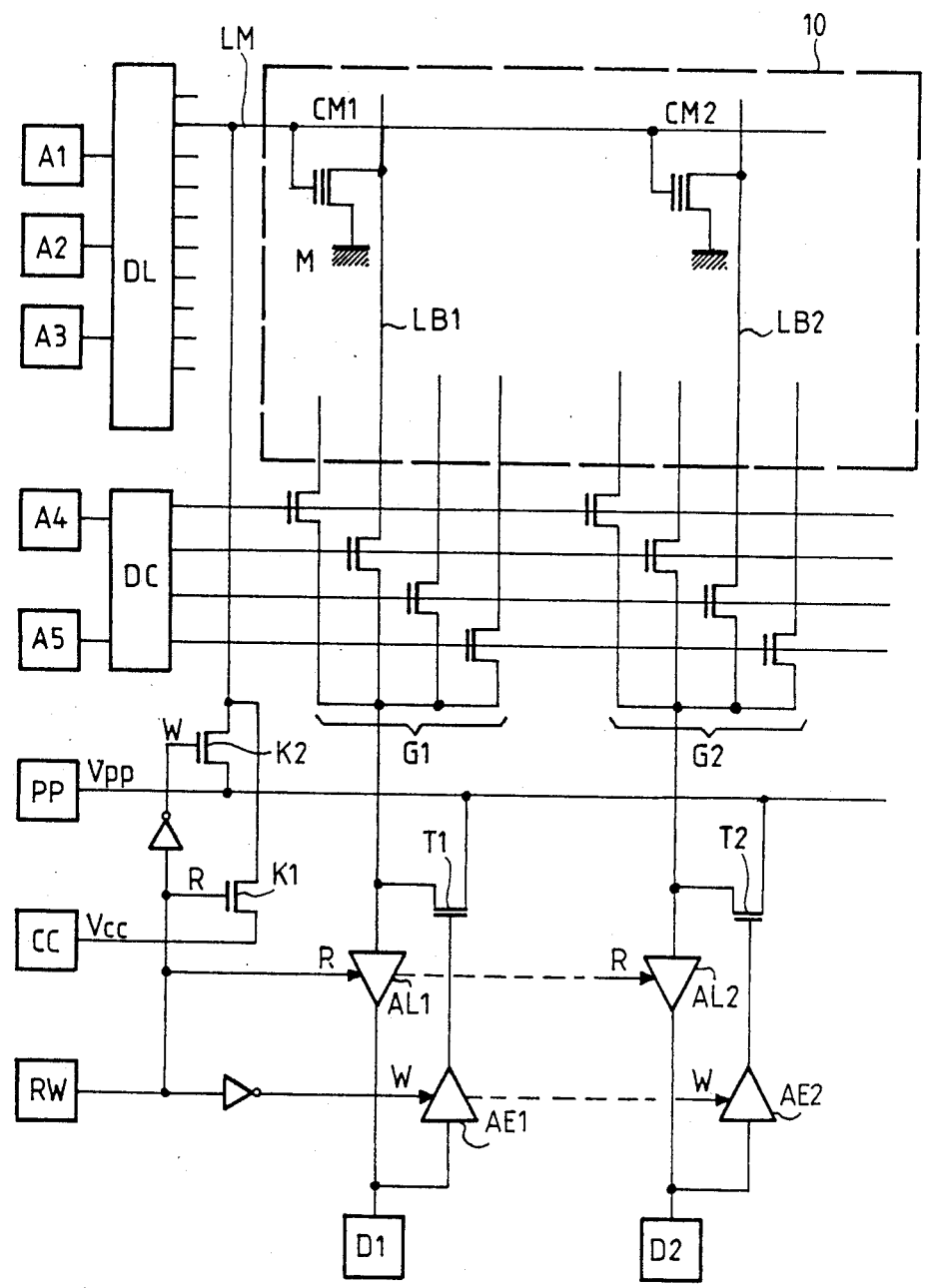
FIG_1 PRIOR ART

FIG_2
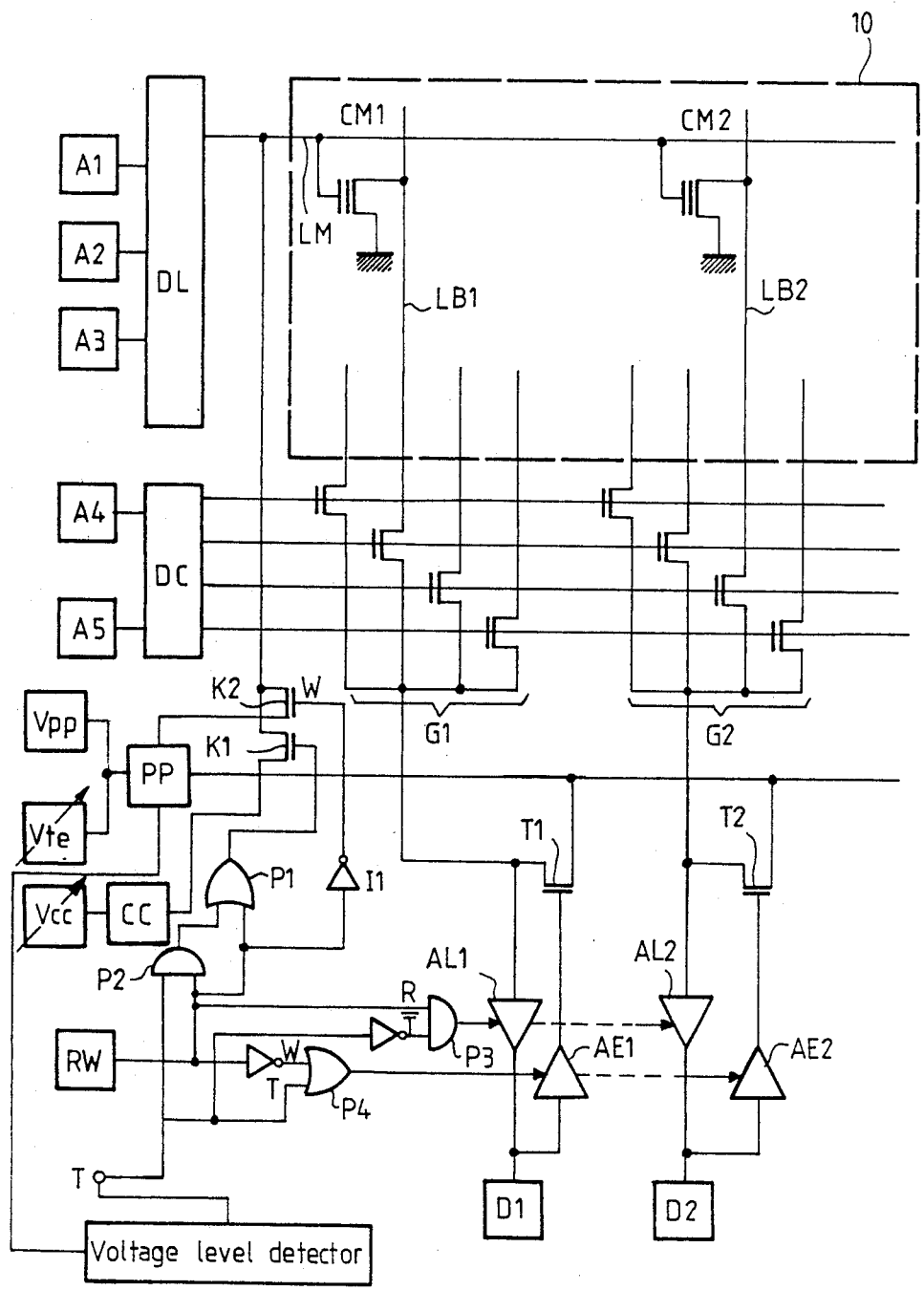

METHOD FOR THE TESTING OF ELECTRICALLY PROGRAMMABLE MEMORY CELLS, AND CORRESPONDING INTEGRATED CIRCUIT

BACKGROUND OF THE INVENTION

1. Field of the Invention

The invention concerns electrically programmable memories (EPROMs). It may also concern electrically erasable programmable memories.

2. Description of the Prior Art

Memory cells commonly used today consist of a floating gate transistor with its gate connected to a word line, its drain to a bit line and its source to a reference potential which is generally the electrical ground of the circuit.

A word line is connected to the gates of all the transistors of one and the same line. A bit line is connected to drains of all the transistors of one and the same column. A cell is addressed by the selection of a bit line and a word line.

The cell is programmed by the injection of electrical charges into the floating gate, by applying a relatively high potential to the drain and to the gate, the source being grounded.

The state of the cell (i.e. whether it is programmed or not) is read by pre-charging the drain, hence the bit line, at a low voltage and then applying a potential to the gate and detecting the discharge current of the bit line. If this current is high, it means that the cell can easily be made conductive by the read potential. This means that it is not programmed. If the current is very low, it means that the cell has not been made conductive by the read potential applied to the gate. This means that it has been programmed. A threshold comparator detects the current and gives a binary output signal indicating the state of the cell.

A major problem encountered in the manufacture and programming of memories of this type relates to the testing of the memory after programming. It has to be ascertained that the state of the cells is really that which is desired, i.e. that all the cells which have to be programmed, have been programmed, and that those that have to stay blank (i.e. non-programmed) have remained blank.

The simplest test consists in performing a systematic operation to read the state of the cells one after the other, under the normal conditions in which the memory is read, i.e. in performing the test while applying the supply potentials specified for the memory in read mode. By this test, a binary piece of information is collected on the state of each cell.

However, it has been realized that the programming state of a cell is not purely a binary piece of information. The cell may be programmed to a "stronger" or "weaker" extent i.e. the quantity of charges trapped in the floating gate may be greater or smaller.

The present trend is to program the cells very "strongly" for several reasons: a first reason is the fact that the quantity of charges trapped does not remain constant forever. There is a certain degree of loss of charges in time. The information is therefore retained for a limited lifetime which is desired to increase as far as possible. Hence, the quantity of trapped charges is increased at the outset. A second reason is the fact that there is no precise knowledge of the quantity of charges trapped during a programming operation. The programming voltage and duration of the programming pulse are known, but these two parameters must be overestimated on an a priori basis in order to be certain that, even in the most unfavorable cases, the quantity of charges trapped will be sufficient. A third reason is the fact that the user of the memory must be allowed a certain range of variation in the read voltage applied to the word lines. The nominal voltage is, for example, five volts but the reading should be accurate if, for one reason or another, the user applies a slightly greater voltage (for example, six volts). However, the greater the voltage, the greater will be the extent to which the cell will let through current, especially if it is weakly programmed. There is thus a risk that a programmed cell will be considered by the read comparator to be a non-programmed cell, and this is unacceptable.

For all these reasons, the value of the programming voltage and the period for which this voltage is applied during the programming stage are increased. However, increasing the voltage implies oversizing all the circuits which will have to bear this voltage. The result of this is that additional space is taken up on the surface of the integrated circuit. Besides, increasing the duration of the programming stage is a very cumbersome task for memories having a large number of cells, since the programming is done cell by cell (or word by word for memories organized in words).

Since the current flowing through the cell is related to the "stronger" or "weaker" degree to which this cell has been programmed, it may be sought to measure this current, precisely in order to obtain a piece of information on the quantity of trapped charges. This will provide greater efficiency in the subsequent adjustment of the programming conditions or, again, it will enable the reprogramming of cells seen to be insufficiently programmed.

This current can be measured by a test with probe tips during the manufacture of the memory while this memory is still in the state of a semiconducting slice and has not yet been cut out into individual, integrated circuit chips nor encapsulated in a package. This test uses specific circuits and specific testing pads in the integrated circuit. Of course, this test cannot be performed with probe tips, if the memory is programmed only after it has been encapsulated in a enclosed package.

When the memory is encapsulated, the specific testing pads are no longer accessible. The only accessible elements are the connection terminals needed by the user of the memory (supply terminals, addressing terminals and data output terminals) for it is sought to minimize the number of connection terminals for reasons of space and cost.

This is why, until now, the task has been limited to a binary test of the state of the cells of an encapsulated memory to check whether they are programmed or not, without its being really possible to achieve a measurement of programming quality for each of the cells.

An object of the invention is to propose an improved test procedure which resolves these problems and which makes it possible not only to ascertain that the cells are programmed or not programmed but also, in particular:

to give a better definition of the ranges of read voltage values for which the read comparator will give a precise indication on the state of the cells;

to give a better definition of the voltages and programming times sufficient to program the cells with a desired retention period.

SUMMARY OF THE INVENTION

For this purpose, the invention proposes a method for the testing of an electrically programmable memory comprising cells addressable in reading and in programming mode by word lines, the binary state of the cells being capable of being read or written from bit lines, and a programming terminal being provided to receive and apply, to a bit line, a higher programming voltage than the voltages applied in reading mode, a method wherein, in order to test the cell, a read voltage is applied to a word line, the bit line is connected to the programming terminal, this terminal is connected to a source of test voltage with a much lower value than that of the programming voltage and the current flowing between this terminal and the test voltage source is measured.

Thus, it is possible to measure the current in each of the cells as a function of the read voltage applied to the word line and as a function of the voltage applied to the bit line from the programming terminal. This measurement is made on an encapsulated memory since the programming terminal is necessarily accessible from the outside to enable the programming of the memory.

To implement this method in practice, there is provided a very small number of logic gates, enabling the passage from a normal reading mode (which does not use the programming terminal) to a testing mode (using this terminal, but in a different way to that of its use in programming mode).

More precisely, it is provided that the integrated circuit will comprise a logic circuit connected to the programming terminal as well as to a supply terminal giving the read voltages and also connected to a read/write control terminal, said circuit further receiving a test mode signal to apply, in testing mode, the read voltage present at the supply terminal to the word line and the voltage present at the programming terminal to the bit line.

In programming mode, the high voltage present at the programming terminal is applied to both the word line and the bit line. In reading mode, the read voltage present at the supply terminal is applied to the word line, and an internally generated low voltage is applied to the bit line.

The testing mode signal can be applied from outside by a specific testing mode terminal. If it is sought to avoid this terminal, the test signal may be generated, for example, by using a level detector connected to a terminal of the integrated circuit. This terminal may be the programming terminal itself, which would be connected to a level detector circuit giving a test signal when the voltage level, measured at this terminal, is between two specific values which are far lower than the programming voltage.

BRIEF DESCRIPTION OF THE DRAWINGS

Other features and advantages of the invention will emerge from the following detailed description, made with reference figures, of which:

FIG. 1 describes a standard memory structure,

FIG. 2 describes a memory structure that incorporates the invention.

DESCRIPTION OF A PREFERRED EMBODIMENT

To provide a clearer understanding of the invention, FIG. 1 shows an example of a memory structure in which the invention can be applied.

The memory is made on an integrated circuit substrate comprising, firstly, a network 10 of memory cells arranged in rows and columns and, secondly, peripheral circuits and access pads to connect the integrated circuit to external terminals. These terminals are accessible when the integrated circuit is encapsulated in a package.

The individual memory cells of the network 10 consist of floating gate transistors connected to word lines and bit lines.

As an example, the figure shows two memory cells, CM1 and CM2, connected to one and the same word line LM. The transistor of the cell CM1 has its control gate connected to the word line LM, its drain connected to a bit line LB1 and its source connected to an electrical ground M. The transistor of the cell CM2 has its control gate connected to a word line LM, its drain connected to a bit line LB2 and its source connected to the ground. All the transistors of one and the same network row 10 have their gate connected to one and the same word line and all the transistors of one and the same column of the network have their drain connected to one and the same bit line.

The memory is organized into n lines of m words of p bits each. A row decoder DL enables the selection of a designated word line, such as the line LM, and the application of a voltage to this line. A column decoder DC enables the selection of one among m words.

To enable this selection, the bit lines are organized in distinct groups such as G1 and G2, and the column decoder selects a specified bit line in each of the groups. In the example shown, there are two groups of four columns each, and the column decoder selects, for example, the second bit line of each group, namely the line LB1 for the first group and the line LB2 for the second group.

The selection done by the column decoder DC consists in connecting each of the chosen bit lines to the input of a read amplifier, namely AL1 for the group G1 and AL2 for the group G2. The output of the read amplifier is connected to a data input/output pad, D1 for the read amplifier AL1 and D2 for the amplifier AL2. The amplifiers AL1 and AL2 are high-gain amplifiers, working as threshold comparators.

The row decoder DL and the column decoder DC receive addressing signals by address input pads, A1, A2, A3 for the row decoder and A4, A5 for the column decoder. The application of address signals to the address inputs, A1 to A5, enables the connection of the cells, CM1 and CM2, corresponding to a selected word, to the data input/output pads D1 and D2.

The input/output pads, D1 and D2, are connected, moreover, to the inputs of write amplifiers, namely AE1 for the pad D1 and AE2 for the pad D2.

The amplifier AE1 controls a change-over switch T1, enabling the connection of the selected bit line in the group G1 to a programming terminal PP, designed to receive, at the programming or "writing" stage, a programming voltage Vpp (about 12 to 15 volts) which is higher than the normal supply voltages of the circuit.

Similarly, the write amplifier AE2 controls a change-over switch T2, used to connect the selected bit line in the group G2 to the programming terminal PP.

The integrated circuit of FIG. 1 also comprises a read/write control pad RW, designed to receive a binary signal indicating whether it is desired to read the content of a memory word or, on the contrary, to write a content in this word.

Finally, a supply pad CC enables the circuit to be carried to a normal supply voltage Vcc (5 volts for example) which, in particular, is the read voltage applied to the word lines during the reading stage.

In a reading stage, the read amplifiers AL1, AL2 are validated, the write amplifiers AE1, AE2 are inhibited, and the change-over switches T1 and T2 are open. Reciprocally, in a programming stage, the write amplifiers AE1, AE2 are validated, the read amplifiers AL1, AL2 are inhibited and the change-over switches T1 and T2 are open or closed depending on the state of the data given at the pads D1, D2, i.e. depending on the value of the binary word to be written in the memory.

Furthermore, in a reading stage, the supply voltage Vcc ,present at the supply pad CC, is applied to the word line LM by means of a change-over switch K1, controlled by the reading mode signal R present at the terminal RW. Conversely, during the programming stage, it is the programming voltage Vpp, present at the programming pad PP, which is applied to the word line LM by means of a change-over switch K2, controlled by the writing mode signal W which is the logical complement of the signal R.

Thus, in a reading stage, a read voltage Vcc (or approximately Vcc) is applied to the word line LM by means of the change-over switch K1 after the bit lines are pre-charged at a low pre-charging voltage (one to two volts for example) by a pre-charging circuit (not shown). The current resulting therefrom in the selected bit lines depends on the state (whether programmed or not) of the cell, and it is detected by the read amplifiers which give the desired information on the content of a word of the memory at the data input/output pads D1 and D2.

In a programming stage, a voltage approximately equal to the programming voltage Vpp is applied to only some of the bit lines, depending on the binary signal present at the data input/output pads D1 and D2, through write amplifiers AE1 and AE2 and change-over switches T1 and T2. At the same time, the programming voltage Vpp (or approximately this voltage) is applied to the selected word line by means of the change-over switch K2.

According to the invention, these two configurations of operation are preserved in reading and writing mode, a different configuration is introduced in testing mode to direct the current flowing in the bit lines towards the terminal Vpp.

This results in small circuit modifications and an example of these modifications is shown in FIG. 2. In this figure, elements identical to those of FIG. 1 have the same references and shall not be described again.

The reading and programming modes function exactly as in the case of FIG. 1, under the control of the reading/writing mode signal present at the terminal RW.

A testing mode is provided. It is determined by a logic signal T. The testing mode signal T may be applied from outside the circuit, by a specific testing mode control terminal, or else it may be generated internally from a piece of information applied to the existing terminals such as those of FIG. 1.

In a simple exemplary embodiment, the circuit has a voltage level detector connected to the programming terminal PP. If the voltage level at this terminal is between two specified levels, for example, 1 volt and 3 volts, then the level detector gives a testing mode logic signal T, the logic state of which indicates that the system is in testing mode.

If, on the contrary, the voltage level at the terminal PP is outside the specified range, for example if it is null or equal to Vpp, the level detector connected to the terminal PP gives a signal indicating that the system is not in testing mode.

In another embodiment, it may also be provided that it is the voltage level at another terminal of the circuit which is carried to a higher value than the normal value and which is detected by a circuit giving the testing mode signal.

In the exemplary embodiment described herein, the testing mode will be considered to be capable of being used only if the read/write control terminal RW receives a logic level corresponding to the reading mode. In other words, it is provided that, when the testing is being done, a defined logic level should be imposed on the terminal RW, the other level being incompatible with the testing mode. However, a different approach could be considered, for example an approach in which the logic level of the terminal RW is immaterial or corresponds to the write command.

According to the invention, in testing mode, the voltage Vcc at the supply terminal CC is applied by means of the change-over switch K1 to the selected word line LM as it is applied to this line in reading mode. At the same time, the read amplifiers AL1, AL2 are inhibited (unlike what happens in reading mode) and the write amplifiers AE1, AE2 are validated to command the closing of one of the change-over switches T1, T2 depending on an appropriate logic signal, applied to a corresponding input pad D1 or D2. The other change-over switch or switches remain open.

Consequently, in testing mode, a single bit line is connected to the programming pad PP: this line is selected, firstly, by a column address introduced through the pads A4 and A5 and, secondly, by the selection of a single data input/output pad to which a first logic level logic signal is applied, the other pads receiving an complementary logic level signal.

Finally, in testing mode, the programming terminal PP is connected, outside the integrated circuit, to a source of test voltage with a low value (for example a voltage Vte of 2 volts) as compared with the programming voltage Vpp. The current flowing between the test voltage source and the programming terminal PP is measured outside the circuit. This current is the one flowing in the selected bit line. It can be measured either for a test voltage Vte and a read voltage Vcc, which are well defined, or by causing either of these voltages to vary in order to determine a curve giving indications on:

the programming state of the cell, the quantity of the charges trapped in the floating gate.

This curve can be read cell by cell by successively addressing all the cells by the addressing pads A1 to A5 and the data input/output pads D1 and D2.

FIG. 2 shows, as an example, logic circuits enabling the system to go into a testing, reading or programming stage, depending on the testing mode signal T and the reading/writing mode control signal present at the terminal RW. It is assumed that if the reading mode signal R is at the high logic level, the system goes into reading mode, that if the complementary signal W is at the high level, the system goes into programming mode and that if both R and T are at the high level, the system is in testing mode, with the combination W and T at the high level being prohibited.

It is thus that the switch K2 is controlled by the signal W at the high level by means of an inverter I1. The switch K1 is controlled by an OR gate P1 receiving, firstly, signal R (so that the switch K1 is closed in reading mode) and, secondly, the output of an AND gate P2 which receives the signals R and T (so that the switch gets closed in testing mode only provided that R is at the top level).

The read amplifiers AL1, AL2 are validated by the output of an AND gate P3 which receives, firstly, the signal R and, secondly, the complement of the signal T (so that the read amplifiers will be validated in reading mode but not in testing mode).

The write amplifiers AE1, AE2 are validated by the output of an OR gate P4 receiving the signal W and the signal T (so that these write amplifiers will be validated in programming mode and in testing mode.

The above description has been given for a memory organized in eight lines (three row address pads A1, A2, A3) of four words (two column address pads A4, A5) of two bits (two data input/output pads D1, D2). More generally it can be applied to N lines or M words of P bits.

What is claimed is:

1. A method for the testing of an electrically programmable memory comprising cells addressable in reading an in programming mode by word lines, the binary state of the cells being capable of being read or written from bit lines, and a programming terminal being provided to receive and apply, to a bit line, a higher programming voltage than the voltages applied in reading mode, wherein said method, in order to est a cell, a read voltage is applied to a word line, the bit line is connected to the programming terminal, said programming terminal is connected to a source of test voltage with a much lower value than that of the programming voltage and a current flowing between this terminal and the test voltage source is measured.

2. A testing method according to claim 1, wherein the read voltage produced from an external source voltage, takes different values and wherein the current is measured for said different values, determining a curve of the current as a function of the read voltage.

3. A testing method according claim 1 or claim 2, wherein the memory is organized in n lines of m words of p bits, the data corresponding to each memory word being capable of being read or recorded from p data input/output pads, wherein the test comprises an operation for the selection of one data bit from among p, said selection being done by the application of a logic signal of a first level to one of the data input/output pads and a second level, complementary to the first level, to all the other data input/output pads.

4. A testing method according claim 1 or claim 2, wherein a specific signal is applied to at least one external terminal of the integrated circuit to indicate that the system is in testing mode.

5. A testing method according claim 1 or claim 2, wherein no specific signal indicating that the system is in testing mode is applied, and wherein the integrated circuit includes a mean to detect the presence at the programming terminal of a voltage ranging between two specified voltages levels which are far below that of the programming voltage.

6. An electrically programmable memory integrated circuit comprising a network of memory cells which can be addressed in reading and programming by word lines, the state of the cells being capable of being read or recorded from bit lines, and a programming terminal being provided to receive and apply, to a bit line, a programming voltage which is higher than voltages applied in reading mode a read voltage is applied to a word line and a test voltage is applied to the bit lines, said circuit comprising a first logic circuit and a second logic circuit receiving both a reading mode signal, a programming mode signal and a testing mode signal, said first logic circuit controlling the application on the word line of either the voltage present at the programming terminal when the memory is in programming mode, or the read voltage when the memory is in reading or testing mode, said second logic circuit connecting a bit line to the programming terminal when the memory is in testing or programming mode.

7. A circuit according to claim 6, wherein, in testing mode, the second logic circuit inhibits a read amplifier, connected between the bit line and a data input/output pad.

8. A circuit according to claim 6 or claim 7, comprising a testing mode terminal to receive a testing mode signal.

9. A circuit according to claim 6 or claim 7, comprising a circuit for the detection of voltage levels, giving a testing mode signal when the voltage present at the programming terminal ranges between two specified levels which are considerably below that of the programming voltage.

* * * * *